US006939739B2

(12) United States Patent
Corisis

(10) Patent No.: US 6,939,739 B2
(45) Date of Patent: *Sep. 6, 2005

(54) INTEGRATED CIRCUIT PACKAGES, BALL-GRID ARRAY INTEGRATED CIRCUIT PACKAGES AND METHODS OF PACKAGING AN INTEGRATED CIRCUIT

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/841,036

(22) Filed: May 6, 2004

(65) Prior Publication Data

US 2004/0207060 A1 Oct. 21, 2004

Related U.S. Application Data

(62) Division of application No. 09/970,275, filed on Oct. 2, 2001, now Pat. No. 6,743,658, which is a division of application No. 09/253,227, filed on Feb. 19, 1999, now Pat. No. 6,856,013.

(51) Int. Cl.[7] .......................... H01L 21/44; H01L 21/48; H01L 21/50
(52) U.S. Cl. .......................... 438/108; 438/118; 438/126
(58) Field of Search .......................... 165/80.2, 185; 257/666, 673, 679, 680, 692, 693, 706, 707, 712, 713, 721, 723, 738, 756, 772, 774, 775, 778, 779, 787; 438/106, 108, 118, 122, 125, 127

(56) References Cited

U.S. PATENT DOCUMENTS

| 5,021,300 A | 6/1991 | Stacey |
| 5,248,895 A | 9/1993 | Nakazawa |
| 5,289,346 A | 2/1994 | Carey et al. |
| 5,300,812 A | 4/1994 | Lupinski et al. |
| 5,352,851 A | 10/1994 | Wallace et al. |
| 5,359,768 A | 11/1994 | Haley |
| 5,442,231 A | 8/1995 | Miyamoto et al. |
| 5,559,369 A | 9/1996 | Newman |

(Continued)

OTHER PUBLICATIONS

"How to Make IC Package"; www.msato@iis.u-tokyo.ac.jp; Aug. 31, 1998, 10 pps.
SLD4M18DR400 4 MEG×18 SLDRAM; www.sldram-.com; 1998, 12 pps.
Tummala et al.; Microelectronics Packaging Handbook; 1997, Chapman & Hall vol. II; pp. 898–901.

(Continued)

Primary Examiner—Asok Kumar Sarkar
(74) Attorney, Agent, or Firm—Wells St. John, P.S.

(Continued)

(57) ABSTRACT

The present invention includes integrated circuit packages, ball-grid array integrated circuit packages and methods of packaging an integrated circuit. One aspect of the present invention provides an integrated circuit package including a substrate having opposing first and second substrate surfaces and at least one electrical connection supported by the first substrate surface and adapted to couple with circuitry external of the package; a semiconductor die including circuitry electrically coupled with the at least one electrical connection; a first die surface coupled with the second substrate surface; a second die surface; and a cover coupled with the second die surface. Another aspect of the present invention includes a method of packaging an integrated circuit including providing a semiconductor die having circuitry; providing a substrate having at least one electrical connection; electrically coupling the circuitry of the semiconductor die with the at least one electrical connection; providing a cover; and covering a surface of the semiconductor die using the cover, the covering including contacting the solid cover with the semiconductor die surface.

15 Claims, 3 Drawing Sheets

U.S. PATENT DOCUMENTS

| | | |
|---|---|---|
| 5,650,593 A | 7/1997 | McMillan et al. |
| 5,661,086 A | 8/1997 | Nakashima et al. |
| 5,677,566 A | 10/1997 | King et al. |
| 5,723,907 A | 3/1998 | Akram |
| 5,726,079 A | 3/1998 | Johnson |
| 5,739,585 A | 4/1998 | Akram et al. |
| 5,817,535 A | 10/1998 | Akram |
| 5,857,767 A | 1/1999 | Hochstein |
| 5,972,736 A | 10/1999 | Malladi et al. |
| 5,985,697 A | 11/1999 | Chaney et al. |
| 5,990,550 A | 11/1999 | Umezawa |
| 5,998,241 A | 12/1999 | Niwa |
| 5,998,860 A | 12/1999 | Chan et al. |
| 5,998,865 A | 12/1999 | Akram |
| 5,999,415 A | 12/1999 | Hamzehdoost |
| 6,008,074 A | 12/1999 | Brand |
| 6,020,637 A | 2/2000 | Karnezos |
| 6,048,755 A | 4/2000 | Jiang et al. |
| 6,107,683 A | 8/2000 | Castro |
| 6,122,171 A | 9/2000 | Akram et al. |
| 6,198,162 B1 | 3/2001 | Corisis |
| 6,214,641 B1 | 4/2001 | Akram |
| 6,215,180 B1 | 4/2001 | Chen et al. |
| 6,225,695 B1 | 5/2001 | Chia et al. |
| 6,229,227 B1 | 5/2001 | Muthukumaraswamy et al. |
| 6,249,041 B1 | 6/2001 | Kasem et al. |
| 6,255,140 B1 | 7/2001 | Wang |
| 6,271,586 B1 | 8/2001 | Shen |
| 6,284,571 B1 | 9/2001 | Corisis et al. |
| 6,300,165 B2 | 10/2001 | Castro |
| 6,326,687 B1 | 12/2001 | Corisis |
| 6,343,019 B1 | 1/2002 | Jiang et al. |
| 6,399,425 B1 | 6/2002 | Brand et al. |
| 6,461,894 B2 | 10/2002 | Brand |
| 6,498,052 B2 | 12/2002 | Brand |
| 6,507,114 B2 | 1/2003 | Hui et al. |
| 6,507,116 B1 | 1/2003 | Caletka et al. |
| 6,518,098 B2 | 2/2003 | Corisis |
| 6,528,890 B1 | 3/2003 | Brand |
| 6,586,280 B2 | 7/2003 | Cheah |

OTHER PUBLICATIONS

U.S. Appl. No. 09/203,881; filed Dec. 1, 1998; "Circuit, Method of Adhering an Integrated Circuit Device to a Substrate, and Method of Forming a Circuit"; Original Application; CPA Preliminary Amendment filed Apr. 16, 2001; Amendment filed Dec. 14, 2001; Amendment filed Jul. 14, 2000; Pending Claims.

Tummala et al.; Microelectronics Packaging Handbook; 1997, Chapman & Hall vol. III; pps. 223–234.

"Silver," http://en.wikipedia.org/wiki/Silver, 2001; 4 pps.

"Easy Heatsink Mods to Drop CPU Temps;" Wagner et al.; http://www.overclockers.com/tips188/; Sep. 1, 2000; 7 pps.

"Cooling Fundamentals: Thermal Conductivity;" http://www.frostytech.com/articleview.cfm?articleID=233: 1997; 3 pps.

"Thermal Conductivity of Metals (at 100° K)," 1997; http://www.reade.com/Particle_Briefings/thermal_con_metals.html, 7 pages.

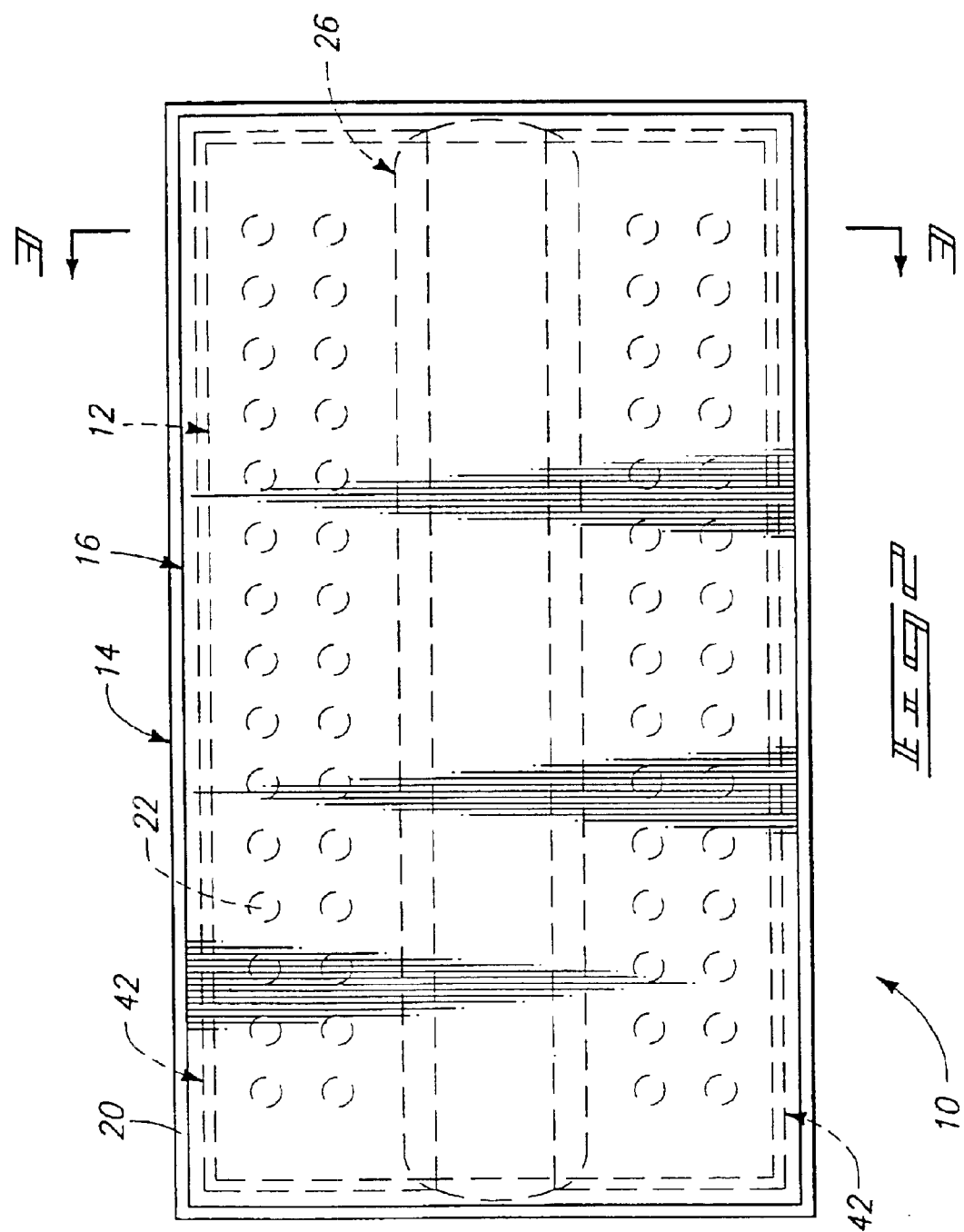

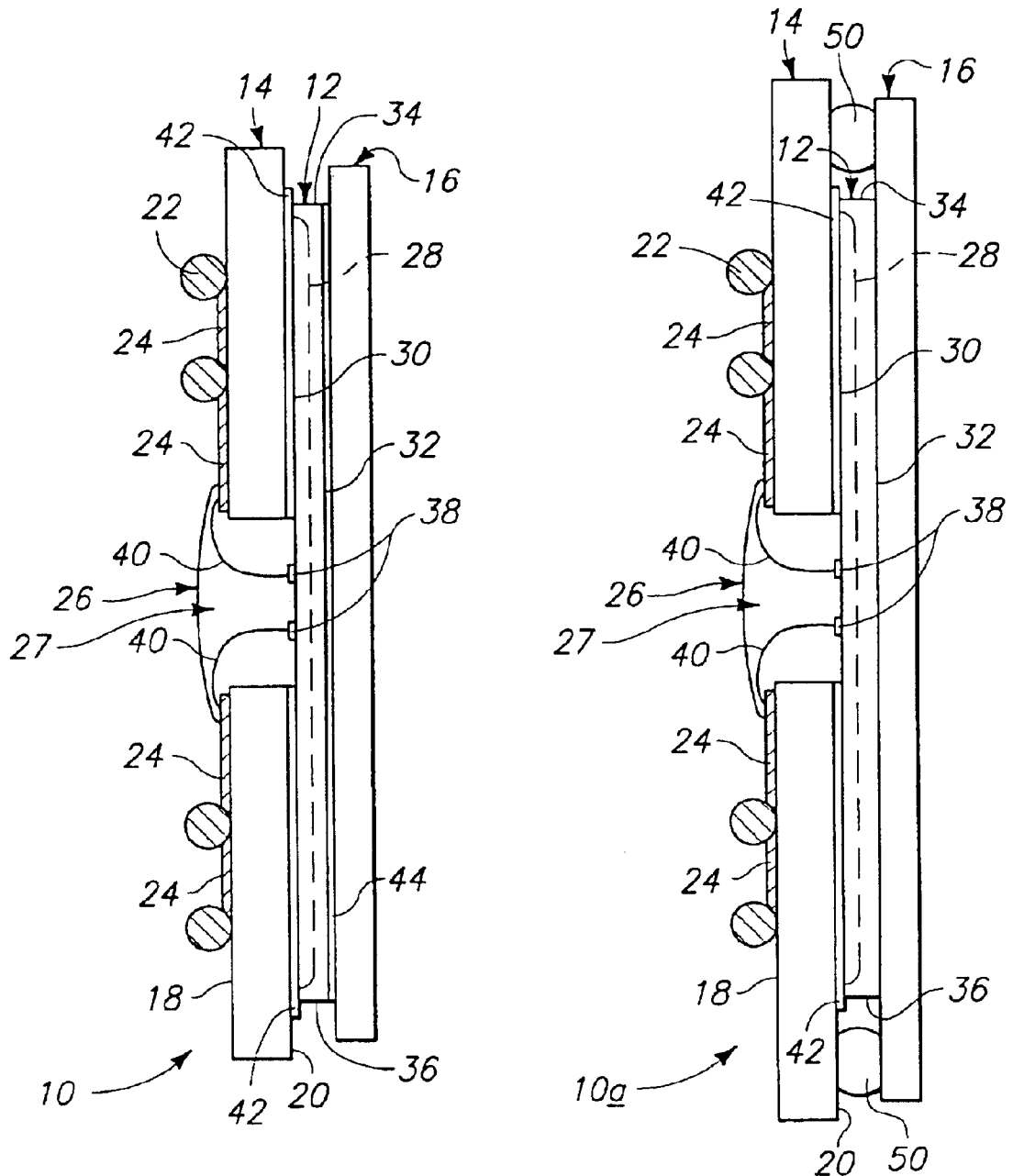

INTEGRATED CIRCUIT PACKAGES, BALL-GRID ARRAY INTEGRATED CIRCUIT PACKAGES AND METHODS OF PACKAGING AN INTEGRATED CIRCUIT This patent resulted from a divisional of and claims priority to U.S. patent application Ser. No. 09/970,275, filed on Oct. 2, 2001, now U.S. Pat. No. 6,743,658, entitled "Methods of Packaging an Integrated Circuit", naming David J. Corisis as inventor, which is a divisional of U.S. patent application Ser. No. 09/253,227, filed on Feb. 19, 1999, now U.S. Pat. No. 6,856,013, entitled "Integrated Circuit Packages, Ball-Grid Array Integrated Circuit Packages and Methods of Packaging an Integrated Circuit", naming David J. Corisis as inventor, the disclosures of which are incorporated herein by reference.

TECHNICAL FIELD

The present invention relates to integrated circuit packages, ball-grid array integrated circuit packages and methods of packaging an integrated circuit.

BACKGROUND OF THE INVENTION

Numerous improvements within integrated circuit technology have been made in recent years. Example improvements include the provision of an increased number of devices, such as transistors, on a single semiconductor die. Further, technological advancements have reduced the overall size of individual semiconductor dies in general. Such improvements provide processing devices which can operate at increased speeds as well as memory devices which are capable of storing increased amounts of data within a single device.

The improvements have not been limited to the semiconductor dies themselves. In particular, numerous improvements have been made in packaging technologies for semiconductor dies. Chip scale packages (CSP) have been developed to provide improved package arrangements for integrated circuit devices. Exemplary chip scale packages include ball-grid array (BGA) packages and fine pitch ball-grid (FBGA) packages.

In BGA and FBGA packaging techniques, a fabricated semiconductor die such as a dynamic random-access memory chip is adhered by tape or other adhesive to a surface of a printed circuit board (PCB) or other substrate. The substrate typically has a plurality of conductive traces formed upon an opposing surface from the adhered semiconductor die. The printed circuit board additionally includes a plurality of solder balls formed in electrical connection with respective ones of the conductive traces. Integrated circuitry of the semiconductor die is coupled with the traces and conductive bumps. Such can be accomplished using wire bonding connections in an exemplary configuration.

Chip scale packaging technology provides numerous improvements over conventional leadframe-type semiconductor packaging technology. For example, chip scale packages provide semiconductor die packages having improved electrical performance (e.g., reduced parasitic capacitance and inductance). In addition, such packages provide shorter distances intermediate bond pads of the semiconductor die and the conductive bumps configured to couple with circuitry external of the integrated circuit package. Such improves the speed of performance of the integrated circuit package.

In addition to performance improvements, chip scale packages provide maximized usage of substrate real estate.

More specifically, chip scale packages have a footprint which is only slightly larger than the size of the semiconductor die. In some conventional packaging technologies, the semiconductor die comprises only approximately 25 percent of the package area and the remainder comprises an encapsulating epoxy. Further, chip scale packages provide an integrated circuit package having an overall height which is smaller than conventional semiconductor device packages. For example, exemplary chip scale packages have a height of approximately 1.2 millimeters or less for use in specialized applications.

However, a distinct disadvantage exists with conventional chip scale packages. In particular, a first surface of the semiconductor die is typically affixed to the printed circuit board or other substrate of the package. The opposing side of the semiconductor die is exposed and is subject to damage. In particular, such integrated circuit packages individually having an exposed semiconductor die surface are highly vulnerable to damage during testing or other handling of the packages. As a result, a comparatively lower yield of chip scale packages has been observed during test and board assembly.

Therefore, a need exists to provide improved structures and methodologies for packaging semiconductor dies.

SUMMARY OF THE INVENTION

The present invention relates to integrated circuit packages, ball-grid array integrated circuit packages and methods of packaging an integrated circuit. The disclosed integrated circuit package comprises a ball-grid array package. The present invention is also applicable to other integrated circuit packaging technologies.

One aspect of the present invention provides an integrated circuit package including a substrate having opposing first and second substrate surfaces. Further, the integrated circuit package includes at least one electrical connection supported by the first substrate surface and adapted to couple with circuitry external of the package. A semiconductor die is also provided and includes circuitry electrically coupled with the at least one electrical connection, a first die surface coupled with the second substrate surface, and a second die surface. The integrated circuit package also includes a cover coupled with the second die surface.

According to other aspects of the present invention, the cover is adhered to the semiconductor die. The cover may be adhered to substantially the entire area of the second die surface. The cover is preferably only coupled with one surface of the semiconductor die and is not received laterally over sidewalls of the semiconductor die. The cover is not adhered to the substrate according to another aspect of the present invention. The cover is preferably spaced from the substrate. The cover can be preformed and have a predefined shape. The cover is substantially planar in the disclosed embodiment.

The present invention provides additional structural aspects. Further, the present invention includes methods according to other aspects.

BRIEF DESCRIPTION OF THE DRAWINGS

Preferred embodiments of the invention are described below with reference to the following accompanying drawings.

FIG. 2 is an elevational plan view of the integrated circuit package shown in FIG. 1.

FIG. 3 is a cross-sectional view of the integrated circuit package taken along line 3—3 of FIG. 2.

FIG. 4 is a cross-sectional view of an alternative integrated circuit package.

DETAILED DESCRIPTION OF THE PREFERRED EMBODIMENTS

Figure 1:
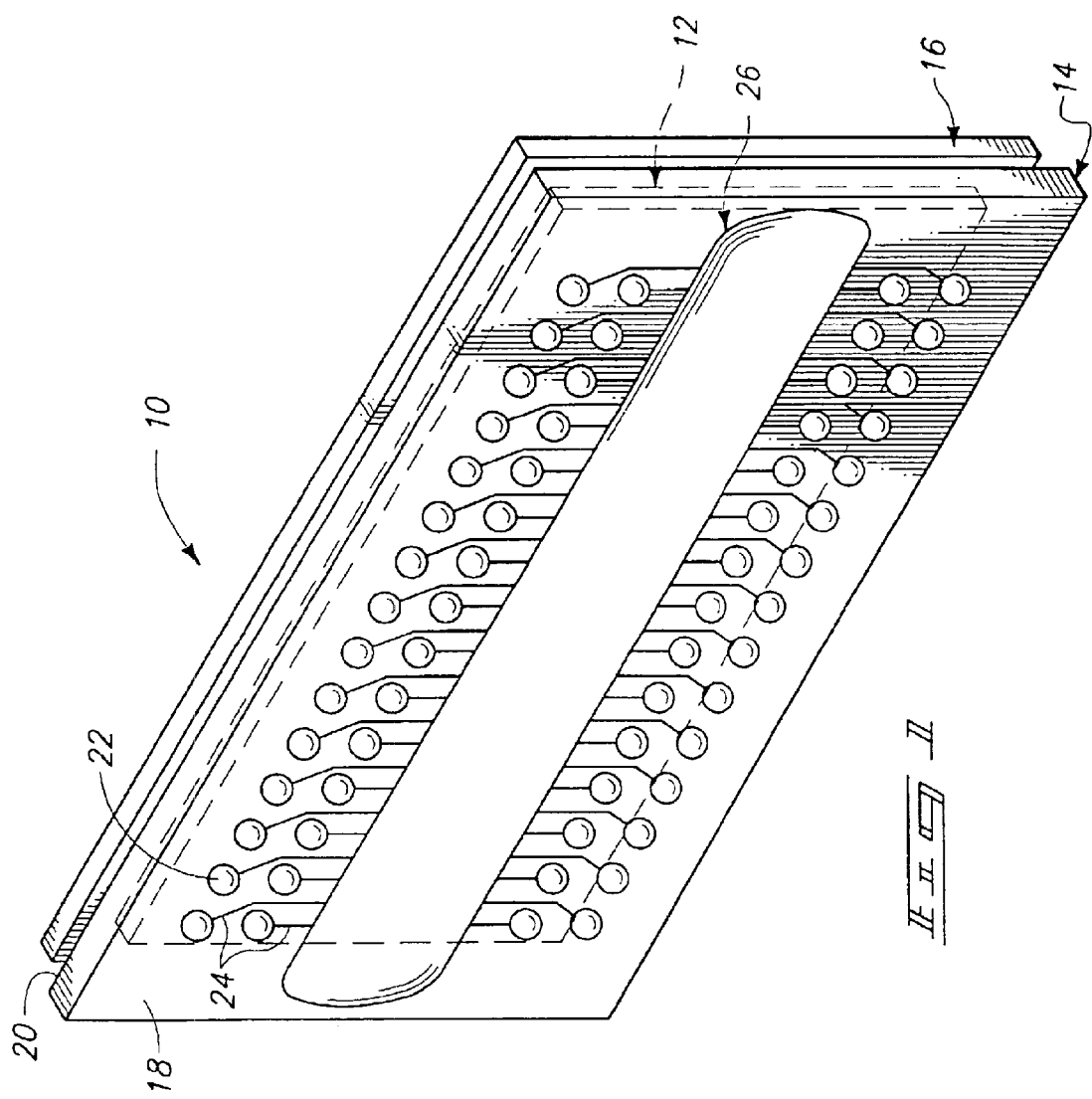
FIG. 1 is a perspective view of an integrated circuit package according to one aspect of the present invention.

This disclosure of the invention is submitted in furtherance of the constitutional purposes of the U.S. Patent Laws "to promote the progress of science and useful arts" (Article 1, Section 8).

Referring to FIG. 1, an integrated circuit package 10 according to the present invention is illustrated. The depicted integrated circuit package 10 comprises a ball-grid array (BGA). The depicted configuration is exemplary and the present invention can encompass other packaging configurations. For example, if the pitch of adjacent conductors is approximately one millimeter or less, package 10 comprises a fine pitch ball-grid array (FBGA) integrated circuit package.

Alternatively, other integrated circuit package configurations according to the present invention are provided.

Integrated circuit package 10 includes a semiconductor die 12, a substrate 14 and a cover 16. An exemplary semiconductor die 12 includes memory device circuitry and/or processing device circuitry. Substrate 14 is a printed circuit board operable to couple with semiconductor die 12 in the depicted embodiment. Substrate 14 includes a first surface 18 and a second surface 20 opposite first surface 18. A plurality of electrical connections in the form of conductive bumps 22 are formed upon first surface 18 of substrate 14. Conductive bumps 22 comprise solder balls of a ball-grid array integrated circuit package in the depicted embodiment. The solder balls have a pitch of approximately one millimeter or less in fine pitch ball-grid array arrangements. Conductive bumps 22 are adapted to provide coupling with circuitry (not shown) external of integrated circuit package 10. Exemplary external circuitry includes conductive pads and conductive traces of a motherboard.

A plurality of conductive traces 24 are formed upon first surface 18 of substrate 14 and are coupled with respective conductive bumps 22. Conductive traces 24 operate to couple respective conductive bumps 22 with integrated circuitry of semiconductor die 12 via a plurality of wire bonding connections (shown in FIG. 3). Substrate 14 includes an encapsulant filling 26 to encapsulate connections of conductive traces 24 with such wire bonding connections. Encapsulant filling 26 operates to fill an opening (also shown in FIG. 3) within substrate 14 and hermetically seal and protect the wire bonding connections. Encapsulant filling 26 may be formed using glob-top encapsulation processing techniques wherein the encapsulant is applied by syringe application.

Other configurations of integrated circuit package 10 are possible. For example, substrate 14 can include a plurality of vias having conductors therein to provide desired electrical connections. Via conductors formed within substrate 14 can conductively couple conductive bumps 22 with appropriate bond pads of integrated circuitry of semiconductor die 12.

Conductive bumps 22 are arranged in an array having a predefined pattern corresponding to pad connections of a substrate to which the integrated circuit package 10 will be coupled. Conductive bumps 22 are individually configured to provide coupling with one of an input/output (I/O) signalling node or a power node, such as a $V_{SS}$ or $V_{DD}$ voltage reference node. Conductive bumps 22 are provided in other arrangements in other embodiments.

Referring to FIG. 2, one configuration of cover 16 is illustrated over semiconductor die 12 and substrate 14. An adhesive 42 comprising plural strips is provided to couple semiconductor die 12 with substrate 14. Further, cover 16 is preferably coupled with a surface of semiconductor die 12. Cover 16 preferably comprises a preformed cover having a predefined shape. For example, cover 16 has a substantially rectangular and planar shape in the depicted embodiment. Cover 16 is preferably formed prior to application thereof to semiconductor die 12. Cover 16 is solid in an exemplary preferred embodiment. As illustrated, cover 16 is preferably sized to cover substantially the entire area or entirety of a surface of semiconductor die 12.

Cover 16 is fabricated from plastic or ceramic in exemplary configurations. Alternatively, other materials can be utilized to form cover 16. For example, cover 16 can be fabricated from an electrically conductive material, such as metal, and configured to function as a ground plane to enhance the electrical operation of semiconductor die 12. In such a configuration, it is desirable to electrically couple the conductive cover 16 functioning as a ground plane with semiconductor die 12. A conductive epoxy (not shown in FIG. 2) can be provided intermediate cover 16 and semiconductor die 12 to provide such electrical coupling. Alternatively, a conductive post (not shown) may be formed to electrically couple cover 16 and semiconductor die 12.

Referring to FIG. 3, cover 16 is illustrated coupled with semiconductor die 12. Semiconductor die 12 is additionally coupled with substrate 14. Semiconductor die 12 includes integrated circuitry 28. Semiconductor die 12 further includes a first surface 30, opposing second surface 32, and opposing sidewalls 34, 36. Plural electrical connections in the form of bond pads 38 are provided upon first die surface 30 and are electrically coupled with integrated circuitry 28 of semiconductor die 12.

Conductive traces 24 are formed upon surface 18 of substrate 14. Plural wire bonding connections 40 are coupled with respective conductive traces 24. Wire bonding connections 40 and conductive traces 24 electrically couple bond pads 38 of semiconductor die 12 with respective conductive bumps 22. Wire bonding connections 40 pass through an opening 27 formed within substrate 14. Encapsulant filling 26 fills opening 27 in the illustrated arrangement and protects wire bonding connections 40.

Semiconductor die 12 is adhered to substrate 14 in the illustrated embodiment. More specifically, adhesive 42 is provided to intermediate semiconductor die 12 and substrate 14 to couple first die surface 30 and second substrate surface 20. Adhesive 42 comprises adhesive tape or other suitable adhesive to mechanically couple semiconductor die 12 and substrate 14. Other attachment techniques can be used to mechanically couple semiconductor die 12 and substrate 14.

A second adhesive 44 is provided to intermediate semiconductor die 12 and cover 16. Adhesive 44 operates to couple cover 16 to second surface 32 of semiconductor die 12. Adhesive 44 comprises electrically conductive epoxy or a tape adhesive in exemplary embodiments. Adhesive 44 may be electrically conductive if cover 16 is configured to operate as a ground plane. Alternatively, adhesive 44 can comprise a thermally insulative material to substantially thermally insulate cover 16 from semiconductor die 12. Further alternatively, cover 16 may be configured to operate as a heat sink. Cover 16 is provided in a thermally conductive relationship with semiconductor die 12 in such an embodiment to remove heat from semiconductor die 12. Adhesive 44 comprises a substantially thermally conductive adhesive in such an embodiment.

Other attachment techniques can be utilized to couple cover 16 and semiconductor die 12. For example, in an alternative embodiment, cover 16 is mechanically coupled with semiconductor die 12 via crimping.

Cover 16 is adhered to only one semiconductor die surface (e.g., surface 32) in the depicted arrangement. Further, cover 16 is not received laterally over sidewalls 34, 36 of semiconductor die 12. The depicted cover 16 is not adhered to substrate 14. As illustrated, cover 16 is preferably spaced from substrate 14.

According to one fabrication method, cover 16 is coupled with semiconductor die 12 using pick and place equipment. Alternatively, plural covers 16 can be coupled with plural semiconductor dies 12 in strip form similar to leadframe processing techniques.

Referring to FIG. 4, an alternative configuration of an integrated circuit package is represented by reference numeral 10a. Cover 16 directly contacts semiconductor die surface 32 in the depicted embodiment. Integrated circuit package 10a includes adhesive 50 provided laterally of semiconductor die 12. Adhesive 50 is adhered to second substrate surface 20 and cover 16. Although only a portion of adhesive 50 is illustrated in FIG. 4, adhesive 50 may be provided about the entire periphery of semiconductor die 12. An exemplary adhesive 50 comprises an epoxy. Other techniques may be utilized to couple cover 16 with substrate 14 to provide cover 16 in contact with surface 32 of semiconductor die 12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of packaging an integrated circuit comprising:
   providing a semiconductor die having circuitry;
   providing a substrate having at least one electrical connection;
   electrically coupling the circuitry of the semiconductor die with the at least one electrical connection;
   providing an electrically insulative cover;
   contacting the cover with a surface of the semiconductor die; and
   adhering the cover and the substrate using an adhesive provided laterally outwardly of a periphery of the semiconductor die.

2. The method according to claim 1 further comprising spacing the cover from the substrate during the contacting.

3. The method according to claim 1 wherein the providing comprises providing a cover having a substantially preformed shape and the providing is before the contacting.

4. The method according to claim 1 wherein the providing comprises providing a substantially planar cover.

5. The method according to claim 1 further comprising coupling the at least one electrical connection with external circuitry following the contacting.

6. The method according to claim 1 wherein the contacting comprises contacting substantially the entire area of the semiconductor die surface with the cover.

7. The method according to claim 1 further comprising covering only one surface of the semiconductor die using the cover.

8. The method according to claim 1 wherein the providing the substrate comprises providing a ball-grid array substrate having a plurality of conductive balls.

9. The method according to claim 1 wherein the providing the substrate comprises providing a ball-grid array substrate having a plurality of conductive balls having a pitch of approximately one millimeter or less.

10. The method according to claim 1 wherein the cover is not adhered to the semiconductor die.

11. The method according to claim 1 wherein the contacting provides an integrated circuit package comprising the semiconductor die having a plurality of outwardly exposed die surfaces during operation.

12. An integrated circuit packaging method comprising:
   first physically coupling a semiconductor die and a substrate;
   electrically coupling circuitry of the semiconductor die with an electrical connection of the substrate;
   second physically coupling a cover with the semiconductor die; and
   wherein the second physically coupling provides the coupled semiconductor die and cover in an arrangement wherein a plurality of die surfaces of the semiconductor die are outwardly exposed during operation.

13. An integrated circuit packaging method comprising:
   first physically coupling a semiconductor die and a substrate;
   electrically coupling circuitry of the semiconductor die with an electrical connection of the substrate;
   second physically coupling a cover with the semiconductor die; and
   wherein the second physically coupling comprises coupling using an adhesive provided laterally outside a periphery of the semiconductor die and intermediate the substrate and the cover.

14. A method of packaging an integrated circuit comprising:
   providing a semiconductor die having circuitry;
   providing a substrate having at least one electrical connection;
   electrically coupling the circuitry of the semiconductor die with the at least one electrical connection;
   providing an electrically insulative cover;
   contacting the cover with a surface of the semiconductor die; and
   wherein the cover is not adhered to the semiconductor die.

15. A method of packaging an integrated circuit comprising:
   providing a semiconductor die having circuitry;
   providing a substrate having at least one electrical connection;
   electrically coupling the circuitry of the semiconductor die with the at least one electrical connection;
   providing an electrically insulative cover;
   contacting the cover with a surface of the semiconductor die; and
   wherein the contacting provides an integrated circuit package comprising the semiconductor die having a plurality of outwardly exposed die surfaces during operation.

* * * * *